United States Patent
Kuo et al.

(10) Patent No.: US 6,529,431 B1
(45) Date of Patent: Mar. 4, 2003

(54) RAPID EQUALIZING GROUND LINE AND SENSE CIRCUIT

(75) Inventors: Sheng-Chang Kuo, Miao-Li (TW); Ti-Wen Chen, Tainan (TW); Hsiang-Pang Li, Taoyuan (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/997,354

(22) Filed: Nov. 27, 2001

(30) Foreign Application Priority Data

Sep. 28, 2001 (TW) ........................................ 90124033 A

(51) Int. Cl.[7] ............................. G11C 7/00; G11C 17/00
(52) U.S. Cl. ......................... 365/203; 365/104; 365/204
(58) Field of Search ............................ 365/96, 104, 202, 365/203, 204

(56) References Cited

U.S. PATENT DOCUMENTS 5,650,959 A * 7/1997 Hayashi et al. ........ 365/185.16
5,757,709 A * 5/1998 Suminaga et al. .......... 365/104
5,886,937 A * 3/1999 Jang ...................... 365/185.25

* cited by examiner

Primary Examiner—Son Mai
(74) Attorney, Agent, or Firm—J.C. Patents

(57) ABSTRACT

A rapid equalizing ground line and sense circuit. The ground line Circuit includes a reference transistor and a plurality of switching circuits. When the ground line signal is disabled, corresponding ground line of the switching circuit couples with the pre-charging bus to initiate a pre-charging operation. If the selected ground line signal is enabled, the selected switching circuit initiates a data sensing operation. If the selected ground line signal is disabled, the corresponding ground line of non-selected switching circuits continues to pre-charge. When the selected ground line signal changes from an enable state to a disable state, the corresponding ground line of the selected switching circuit and corresponding ground line of the non-selected switching circuit are coupled to a voltage source.

8 Claims, 4 Drawing Sheets

RAPID EQUALIZING GROUND LINE AND SENSE CIRCUIT

CROSS-REFERENCE TO RELATED APPLICATION

This application claims the priority benefit of Taiwan application serial no. 90124033, filed Sep. 28, 2001.

BACKGROUND OF THE INVENTION

1. Field of Invention

The present invention relates to an equalizing ground line and sense circuit. More particularly, the present invention relates to a rapid equalizing ground line and sense circuit.

2. Description of Related Art

Most systems nowadays use read-only-memory (ROM) to serve as a single-chip memory for holding basic input/output programs. Hence, a fast data access speed for the ROM is important. To read a particular data bit from a cell o a ROM cell array, selection through ground line, bit line and word line is necessary. However, the selected ground line needs to provide a ground path for a cell current discharged to the ground, and the unselected ground lines need to be charged to a sensing level as other memory cells shielded. Hence, any design capable of shortening the charging/discharging period can immediately increase not only the operating speed of the ROM device but also the entire system.

FIG. 1 is a schematic circuit diagram of a conventional ROM unit. In the past, a circuit such as the one shown in FIG. 1 was used to read off data stored in a selected memory cell. As shown in FIG. 1, the drain terminal of an NMOS transistor 114 inside the ground line circuit 100 couples with the output terminal of an inverter 108. The drain terminal of an NMOS transistor 116 couples with the output terminal ok an inverter 110. The drain terminal of an NMOS transistor 118 couples with the output terminal of an inverter 112. A reference voltage REF1 inputs to the gate terminal of the NMOS transistors 114, 116 and 118. Each ground line couples with the source terminal of the NMOS transistor. When a low potential is applied to the input terminal YGL0 of the inverter 108, the PMOS transistor inside the inverter 108 is conductive so that the ground line 124 is pre-charged to a preset voltage, which is related to the reference voltage REF1. On the other hand, when a high potential is applied to the input terminal YGL0 of the inverter 108, the NMOS transistor inside the inverter 108 is conductive and the reference voltage REF1 turns on the NMOS transistor 114 so that the ground line 124 is coupled with the ground.

In FIG. 1, each ground line utilizes an inverter and an NMOS transistor to control pre-charging and discharging. However, this generates five related problems. In the discharging state, since the gate terminal of the NMOS transistor 114 couples with the reference voltage REF1, not a voltage source, the NMOS transistor 114 is turned into a resistor with high resistance leading to an extension of discharging period for the ground line 124. In addition, since each ground line has an independent pre-charging path, an initial voltage may not be the same at a subsequent sensing operation such that some address may shift during the transient leading to data delay or reading failure. Moreover, when the ground line 124 is pre-charged to over 80%~90% of the preset potential, the pre-charge efficiency be comes worse due to the NMOS transistor 114 a working in a linear region potential. Therefore, a longer period is required in the charging process. Another problem is the coupling of the reference voltage with the ground line. Due to a transient change in the ground line, the reference voltage is de-stabilized. A final problem of the circuit is that each ground line needs to have an NMOS transistor. Hence either difficult layout design has to be implemented or else some odd layout may have to be chosen.

FIG. 2 is a schematic circuit diagram showing another conventional ROM unit. After reading data from the memory cell such as the NMOS transistor 218 inside the memory array 216 via the sense data circuit 204, the NMOS transistor 210 and the NMOS transistor 214, the sensing device 200 triggers the NMOS transistor 214 to return to the cut-off state. The circuit waits until another memory cell 218 is selected. The input terminal of the inverter 208 outputs a high potential so that the NMOS transistor 206 and the NMOS transistor 210 are both in a conductive state. Hence, a charging path from the voltage source VDD to the bit line connected to the NMOS transistor 214 is created. A data sensing operation is initiated until a parasitic capacitance of the bit line connected to the NMOS transistor 214 is charged up to a preset potential. Thus, to rad from a particular memory cell, the chip must wait the full charging period of the parasitic capacitor. Since any actual data sensing operation can be started only after the parasitic capacitor charging period, time is wasted.

SUMMARY OF THE INVENTION

Accordingly, one object of the present invention is to provide a rapid equalizing ground line and sense circuit such that routing of ground lines is simplified. A second object of the invention is to shorten pre-charging time for the ground lines. A third object of the invention is to avoid direct coupling of ground line circuit and reference voltage to the ground lines so that a stable reference voltage is produced. A fourth object of the invention is to shorten discharging time of the ground line circuit and increase data sensing speed through a reduction of ground line resistance. A fifth object of the invention is to pre-charge the bit line before initiating a sensing operation via the sense circuit. Hence, data can be directly read from the memory cell without having to wait for the charging of the parasitic capacitor in the NMOS transistor.

To achieve these and other advantages and in accordance with the purpose of the invention, as embodied and broadly described herein, the invention provides a rapid equalizing ground line circuit. The ground line circuit includes a reference transistor, a switching circuit and a pre-charging bus. The switching circuit couples with the pre-charging bus and a ground voltage. The first terminal of the reference transistor receives a voltage source. A gate terminal of the reference transistor receives the reference voltage. The pre-charging bus couples with the second terminal of the reference transistor and the switching circuit.

Each switching circuit couples respectively with the ground voltage and corresponding ground line for receiving corresponding ground signal and inverted round signal and selecting corresponding ground line potential according to the ground signal and the inverted ground signal.

When a selected ground line signal changes from enable to disable and the selected inverted ground line signal changes from disable to enable, the corresponding ground line of the selected switching circuit changes from coupling with ground voltage into coupling with the pre-charging bus. Meanwhile, the corresponding ground line and all of the other non-selected ground lines couple with the pre-charging bus to initiate a pre-charging operation.

When the ground line signal is disabled and the inverted ground line signal is enabled, the corresponding ground line couples with the pre-charging bus to initiate a pre-charging operation. If the selected ground line signal is enabled and the selected inverted ground line signal is disabled, the selected switching circuit initiates a data sensing operation. Meanwhile, the corresponding ground line of the non-selected switching circuit couples with the pre-charging bus so that the pre-charging operation is continued.

The switching circuit further includes a first transistor and a second transistor. A first terminal of the first transistor couples with a ground voltage. A gate terminal of the first transistor receives a ground line signal. A first terminal of the second transistor couples with the pre-charge bus. The second terminal of the second transistor couples with a second terminal of the first transistor and a corresponding ground line of a memory cell. The gate terminal of the second transistor receives an inverted ground signal.

This invention also provides a rapid equalizing sense circuit. The sense circuit includes a data sense circuit and a control circuit. The data sense circuit outputs data from the selected memory cell. The control circuit receives an inverted sense control signal.

When the inverted sense control signal is in a state of a low potential, a data sensing operation is conducted. Conversely, when the inverted sense control signal is in a state of a high potential, the bit line and the voltage source are coupled together to initialize a pre-charging operation.

In this invention, the non-selected ground line and the voltage source are coupled together to initiate a pre-charging operation and speed the pre-charging of the ground line. In addition, the non-selected bit line and the voltage source are coupled together to initiate a pre-charging operation and speed bit line pre-charging. Hence, drawbacks of conventional ROM circuits are removed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
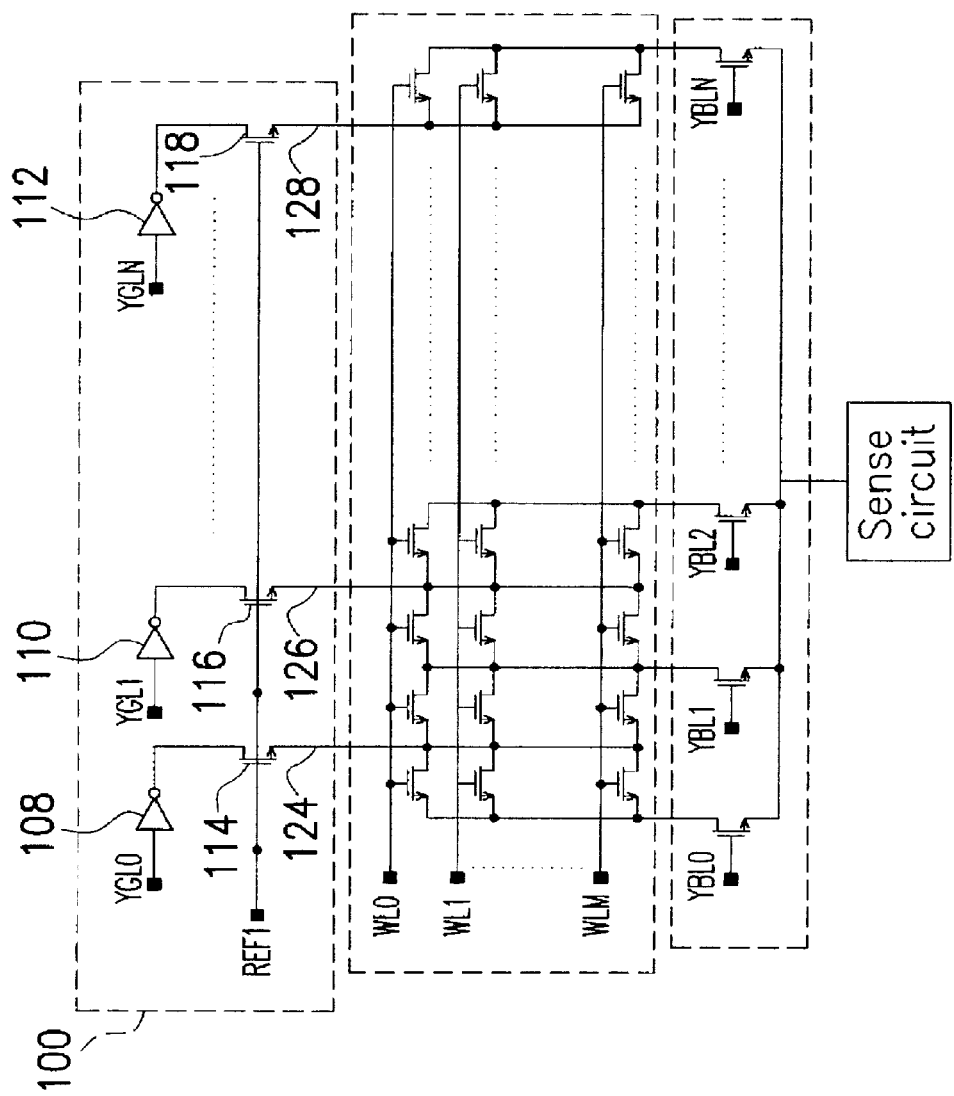
FIG. 1 is a schematic circuit diagram of a conventional ROM unit.
Figure 2:
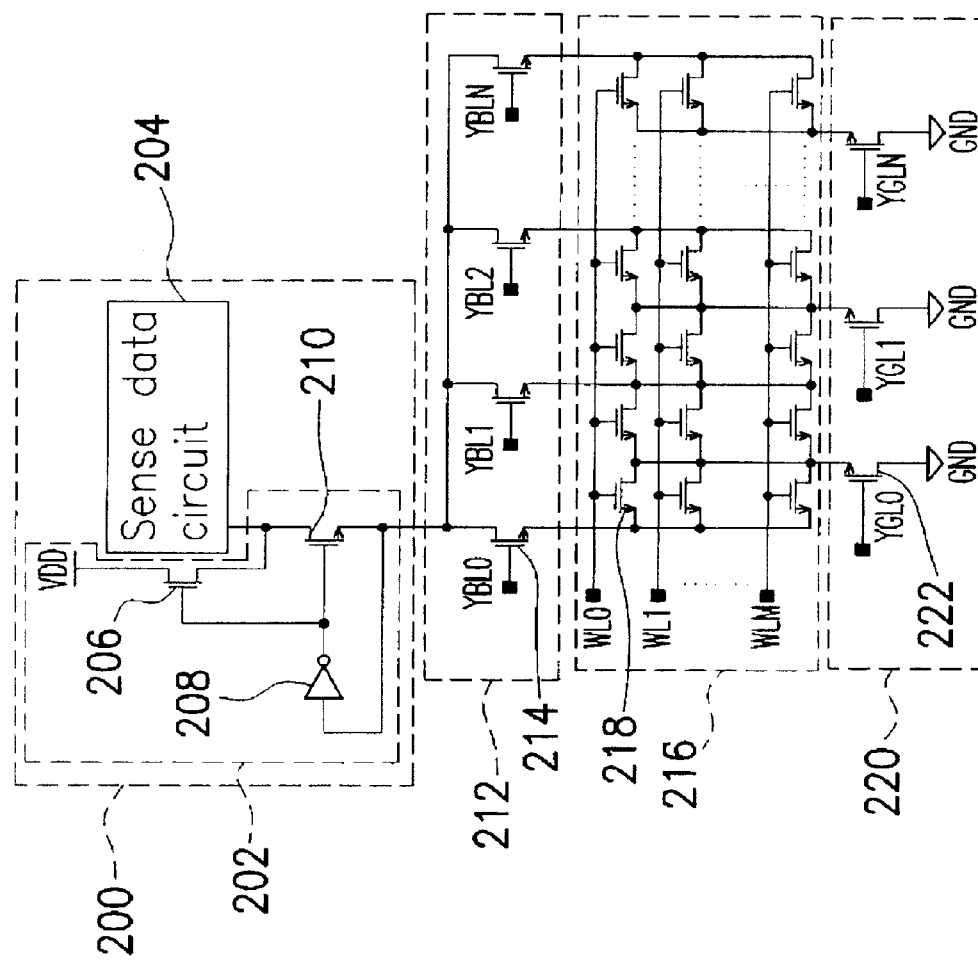
FIG. 2 is a schematic circuit diagram showing another conventional ROM unit.

Reference will now be made in detail to the present preferred embodiments of the invention, examples of which are illustrated in the accompanying drawings. Wherever possible, the same reference numbers are used in the drawings and the description to refer to the same or like parts.

Figure 3:
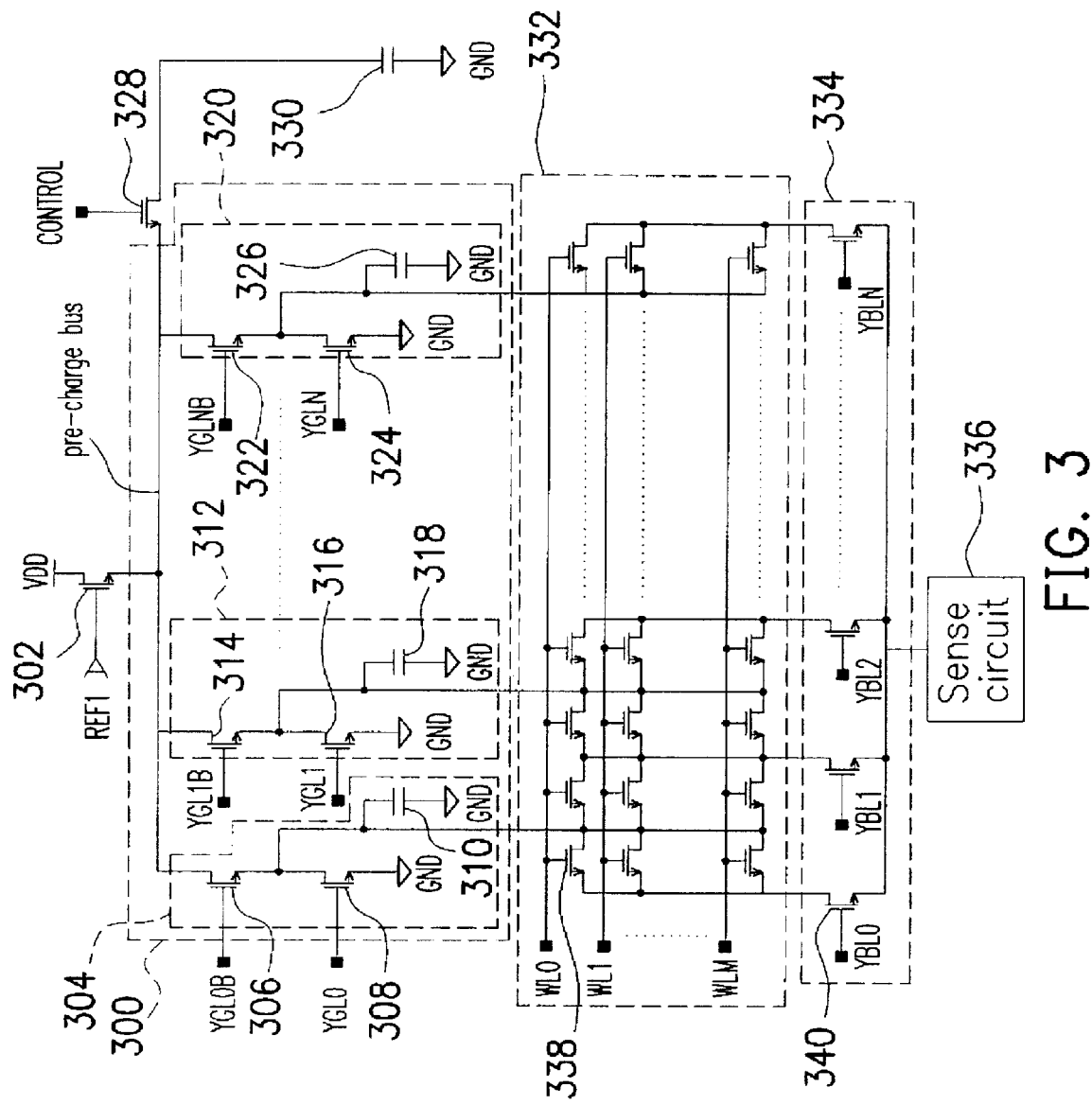
FIG. 3 is a schematic circuit diagram of a rapid equalizing ROM unit according to a first preferred embodiment of this invention.

FIG. 3 is a schematic circuit diagram of a rapid equalizing ROM unit according to a first preferred embodiment of this invention. As shown in FIG. 3, the ground line circuit 300 includes a first NMOS transistor 302, a pre-charge bus, a plurality of switching circuits 304, 312, 320, a second NMOS transistor 328 and a capacitor 330. A drain terminal of the NMOS transistor 302 is coupled to a voltage source (VDD). A source terminal of the NMOS transistor 302 is coupled to the pre-charge bus. The gate terminal of the NMOS transistor 302 is coupled to a reference voltage (REF1). The switching circuits 304, 312, 320 are coupled to the pre-charge bus and a ground voltage. The ground line signal YGL0 and the inverted ground line signal YGL0B are sent to the switching circuit 304. The ground line signal YGL1 and the inverted ground line signal YGL1B are sent to the switching circuit 312. Similarly, the ground line signal YGLN and the inverted ground line signal YGLNB are sent to the switching circuit 320. The source terminal of the NMOS transistor 328 is coupled to the pre-charge bus. A control signal (CONTROL) is sent to the gate terminal of the NMOS transistor 328. The drain terminal of the NMOS transistor 328 is coupled to a capacitor 330.

Each switching circuit is coupled respectively to a ground voltage, a pre-charge bus and a corresponding ground line for receiving a ground line signal and an inverted ground line signal. According to the ground line signal or the inverted ground line signal, a corresponding ground line potential is chosen.

The switching circuit can be further divided into three components. Using the switching circuit 304 as an example, the switching circuit 304 contains a first NMOS transistor 306, a second NMOS transistor 308, a ground line to the substrate, a ground line to the bit line etc., and a parasitic capacitor 310. The source terminal of the NMOS transistor 308 is connected to a ground voltage. The ground line signal YGL0 is sent to the gate terminal of the NMOS transistor 308. The drain terminal of the NMOS transistor 306 is coupled to the pre-charge bus. The source terminal of the NMOS transistor 306 is coupled to the drain terminal of the NMOS transistor 308, the parasitic capacitor 310, and the ground line of memory cell 338. The inverted ground line signal YGL0B is sent to the gate terminal of the NMOS transistor 306. In addition, PMOS or bipolar transistors may be substituted for the NMOS transistors.

When a selected ground line signal changes from enable to disable and a selected inverted ground line signal changes from disable to enable, the corresponding ground line of the selected switching circuit changes from coupling with ground voltage into coupling with the pre-charging bus. Meanwhile, the corresponding ground line and ground lines of the non-selected switching circuit couple with the pre-charging bus to initiate a pre-charging operation.

When the ground line signal is disabled and the inverted ground line is enabled, the corresponding ground line and reference voltage of the ground line circuit couples with the pre-charging bus to initiate a pre-charging operation. If the selected ground line signal is enabled and the selected inverted ground line signal is disabled, the selected switching circuit initiates a data sensing operation. Meanwhile, the corresponding ground line of the non-selected switching circuit couples with the pre-charging bus so that the pre-charging operation is continued.

For example, during system startup, all ground line signals are in a disabled state and all inverted ground line signals are in an enabled state. If the NMOS transistor inside the switching circuit receives the ground line signal, the NMOS transistor such as the NMOS transistor 308, NMOS transistor 316 or the NMOS transistor 324 is in a cut-off state. If the NMOS transistor inside the switching circuit receives the inverted ground line signal, the NMOS transistor such as the NMOS transistor 306, the NMOS transistor 314 or the NMOS transistor 322 is in a conductive state. Due to the differences in the amount of electric charges stored inside the respective parasitic capacitors such as the parasitic capacitors 310, 318, 326 and the conductive state of the NMOS transistor inside the switching circuit (due to the application of an inverted ground line signal to the gate terminal of the NMOS transistor), each parasitic capacitor and voltage source (VDD) is coupled to the pre-charging bus. The voltage source VDD is applied to each parasitic capacitor such as the parasitic capacitor 310 the parasitic capacitor 318 or the parasitic capacitor 326 via the NMOS transistor 302 and the pre-charging bus, thereby forming a multiple of charging circuits. Hence, each parasitic capacitor is pre-charged to a preset voltage.

To read some data, a single chip sends out an address signal to the read-only-memory (ROM) unit. Assume the address is decoded such that the ground line signal YGL0=1, the inverted ground line signal YGL0B=0, the word line signal WL0=1 and the bit line signal YBL0=1 are produced. When the switching circuit 304 of the ground line circuit 300 receives the signals YGL0=1 and YGL0B=0, other inverted ground line signals such as YGL1B and YGLNB are enabled. Therefore, the NMOS transistor 314 and the NMOS transistor 322 are conductive. Because the switching circuit 312 and the switching circuit 320 are connected together, the parasitic capacitor 318 and the parasitic capacitor 326 are coupled to the pre-charge bus. Hence, the parasitic capacitors 318 and 326 are charged to a preset voltage through a charging path leading from the source voltage VDD via the NMOS transistor 302 and the switching circuit.

Since YGL0=1, WL0=1 and YBL0=1, the NMOS transistor 340 and the NMOS transistor 338 are conductive, a data sensing pathway from a sense circuit 336 to ground via NMOS 340, NMOS 338, and NMOS 308 is produced. Hence, the sense circuit 336 is able to conduct a sensing operation. The single chip is thus able to read the required data through the sense circuit 336. When the single chip needs to read data residing in other addresses, YGL0 is changed from enable to disable while YGLB0 changes from disable to enable. Thus, the NMOS transistor 306 is conductive while the NMOS transistor 308 is in a cut-off state.

Because the switching circuits 304, 312 and 320 are connected together, all parasitic capacitors are connected together when the NMOS transistors 306, 314 and 322 are in a conductive state. The high-voltage parasitic capacitor such as the parasitic capacitor 318 produces a current that passes through the NMOS transistor 314 and the NMOS transistor 306 to the low-voltage parasitic capacitor 310 forming a charging pathway. In addition, a charging pathway from the voltage source to the low-voltage parasitic capacitor 310 via the NMOS transistors 302 and 306 is also produced. In this embodiment, the parasitic capacitor 310 is charged through various pathways initiating from at least the voltage source (VDD), the parasitic capacitor 318 and the parasitic capacitor 326. Furthermore, the control signal (CONTROL) may also be used to determine if the route from the parasitic capacitor 330 to the parasitic capacitor 310 via the NMOS transistors 328 and 306 also becomes a charging pathway. Ultimately, charging time for the parasitic capacitor 310 is shortened considerably.

Figure 4:
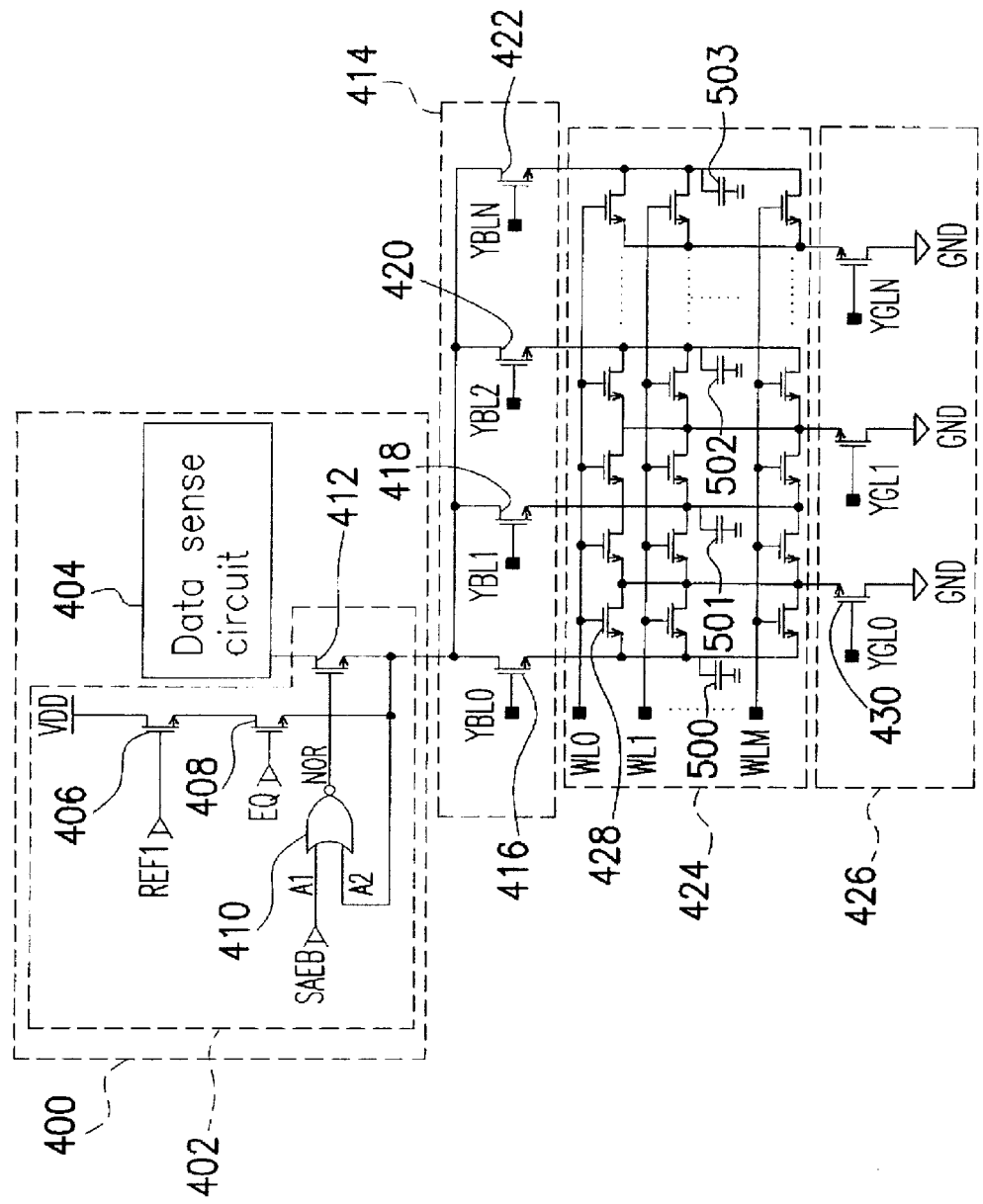
FIG. 4 is a schematic circuit diagram of a rapid equalizing ROM unit according to a second preferred embodiment of this invention.

FIG. 4 is a schematic circuit diagram of a rapid equalizing ROM unit according to a second preferred embodiment of this invention. As shown in FIG. 4, the sense circuit 400 includes a data sensing circuit 404 and a control circuit 402. The data sensing circuit 404 outputs selected memory cell data and the control circuit 402 receives an inverted sense control signal.

When the inverted sense control signal is in low potential, a data sensing operation is conducted. Conversely, when the inverted sense control signal is in high potential, the bit line and the voltage source are coupled together to initiate a pre-charging operation.

The control circuit 402 has NMOS transistors 406, 408 and 412 and a NOR gate 410. The drain terminal of the NMOS transistor 406 is coupled to a voltage source (VDD). The gate terminal of the NMOS transistor 406 is coupled to a terminal for receiving a reference voltage (REF1). The drain terminal of the NMOS transistor 408 is coupled to the source terminal of the NMOS transistor 406. The gate terminal of the NMOS transistor 408 is coupled to a terminal for receiving a sense signal (EQ). A first input terminal of the NOR gate 410 is coupled to a terminal for receiving the inverted sense control signal (SAEB). The drain terminal of the NMOS transistor 412 is coupled to the data sensing circuit 404. The gate terminal of the NMOS transistor 412 is coupled to the output terminal of the NOR gate 410. The source terminal of the NMOS transistor 412, a second input terminal of the NOR gate 410 and the source terminal of the NMOS transistor 408 are coupled to the data line bus. The drain terminal of NMOS transistors (416, 418, 420 and 422) is coupled to the data line bus, too. The gate terminal of the NMOS transistor 416 receives bit line signal YBL0. The NMOS transistor 418 receives bit line signal YBL1. The NMOS transistor 420 receives bit line signal YBL2. The NMOS transistor 422 receives bit line signal YBLN.

To read data from a ROM unit, an address signal is transmitted from the chip to the ROM unit. The inverted sense control signal (SAEB) is in a state of a low potential to initiate a data sensing operation. Assume the address is decoded such that ground line signal YGL0=1, word line signal WL0=1 and bit line signal YBL0=1 are produced. The NMOS transistors 416, 428 and 430 are in a conductive state. Hence, the two input terminals of the NOR gate 410 are in a state of a low potential so that a high potential is output from the output terminal of the NOR gate 410. The conductance of the NMOS transistor 412 produces a data sensing circuit for the chip to read off data from the NMOS transistor 428 via the data sensing circuit 404.

After completing a data sensing operation, the inverted sense control signal (SAEB) is in a state of a high potential. The bit line signals (YBL0, YBL1, YBL2 and YBLN) are also enabled so that the NMOS transistors 416, 418, 420 and 422 are in conductive state and all bit lines are coupled together. To render a source terminal of the NMOS transistor 416, connected to a parasitic capacitor 500 of a bit line, and other NMOS transistors (418, 420, 422) in a identical electric potential, parasitic capacitors 501, 502, 503 of bit lines connected to the NMOS transistors (418, 420, 422) pre-charges the parasitic capacitor 500 until all capacitors have a same potential. If, in addition, the sense signal (EQ) is in a state of a high potential, a charging pathway is created. This charging pathway begins at the voltage source (VDD) and ends at the NMOS transistors (416, 418, 420, 422) while passing through the NMOS transistors 406 and 408 on the way. The parasitic capacitors 500, 501, 502, 503 are charged to a preset potential level. In addition, anyone familiar with semiconductor design knows that PMOS transistors or bipolar transistors may be used instead of NMOS transistors in the circuit.

In conclusion, this invention has five major advantages including:
1. Only a few NMOS transistors are required for all the ground lines. Hence, circuit layout is simplified.
2. A multiple of charging pathways is set up to charge up the capacitor. Hence, charging time is reduced.
3. The reference voltage and the ground line are separate so that the reference voltage is unaffected by address changes. Ultimately, a stable reference voltage is obtained.
4. Discharging period of a selected parasitic capacitor is shortened and data-sensing speed is increased due to the absence of a large ground line resistance.
5. The inverted sense control signal (SAEB) and the sense signal (EQ) are in a state of a high potential and all bit line NMOS transistors are conductive so that the parasitic capacitors of the bit lines are pre-charged before the sense circuit initiates a data sensing operation. Since there is no need to wait for the charging of the parasitic capacitor of the bit lines during a data sensing operation, data is directly read from the memory cell without delay.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A rapid equalizing ground line circuit for a memory chip having a plurality of ground lines, comprising:
    a reference transistor having a first input terminal connected to a voltage source and a gate terminal connected to a reference voltage;
    a plurality of switching circuits, wherein each switching circuit is coupled to a ground voltage and a corresponding ground line for receiving a corresponding ground line signal and an inverted ground line signal and selecting a corresponding ground line potential according to the ground line signal and the inverted ground line signal; and
    a pre-charging bus coupled to a second terminal of the reference transistor and the switching circuits; and
    a charge-accelerating parasitic capacitor, including a capacitor and a control transistor having a first terminal coupled to the capacitor, a second terminal coupled to the pre-charging bus and a gate terminal coupled to a control signal terminal, wherein a decision to connect the capacitor to the pre-charging bus for initiating a pre-charging operation is based on the control signal;
    wherein when the selected ground line signal changes from an enable state to a disable state, the corresponding ground line of the selected switching circuit changes from coupling with the ground voltage to coupling with the pre-charging bus, and the corresponding ground line and the other ground line of the non-selected switching circuit couples with the pre-charging bus to initiate a pre-charging operation.

2. The rapid equalizing ground line circuit of claim 1, wherein each switching circuit comprising:
    a first transistor having a first terminal connected to the ground voltage and a gate terminal connected to the ground line signal terminal; and
    a second transistor having a first terminal connected to the pre-charging bus and a second terminal, connected to the second terminal, of the first transistor and a gate terminal connected to a corresponding inverted ground line signal terminal.

3. The rapid equalizing ground line circuit of claim 2, wherein the first and the second transistor are NMOS transistors.

4. The rapid equalizing ground line circuit of claim 2, wherein the first and the second transistor are PMOS transistors.

5. The rapid equalizing ground line circuit of claim 1, wherein the charge-accelerating parasitic capacitor of the ground line circuit further comprising:
    a capacitor; and
    a control transistor having a first terminal coupled to the capacitor, a second terminal coupled to the pre-charging bus and a gate terminal coupled to a control signal terminal, wherein the decision to connect the capacitor to the pre-charging bus for initiating a pre-charging operation is based on the control signal.

6. A rapid equalizing ground line circuit for a memory chip having a plurality of ground lines, comprising:
    a reference transistor having a first terminal coupled to a voltage source terminal and a gate terminal coupled to a reference voltage terminal;
    a plurality of switching circuits, wherein each switching circuit is coupled to a ground voltage and a corresponding ground line for receiving a corresponding ground line signal and an inverted ground line signal and selecting a corresponding ground line potential according to the ground line signal and the inverted ground line signal; and
    a pre-charging bus coupled to a second terminal of the reference transistor and the switching circuits; and
    a charge-accelerating parasitic capacitor, including a capacitor and a control transistor having a first terminal coupled to the capacitor, a second terminal coupled to the pre-charging bus and a gate terminal coupled to a control signal terminal, wherein a decision to connect the capacitor to the pre-charging bus for initiating a pre-charging operation is based on the control signal;
    wherein if the ground line signal is disabled, the corresponding ground line and reference voltage of the switching circuit couples with the pre-charging bus to initiate a pre-charging operation, and if the ground line signal is enabled, the selected switching circuit initiates a data sensing operation, and corresponding ground line of the non-selected switching circuit couples with the pre-charging bus to continue with the pre-charging operation.

7. A rapid equalizing ground line method for a memory chip, wherein the memory chip comprises a ground line circuit, a memory array and a bit line circuit coupled sequentially, and the ground line circuit comprises a plurality of switching circuits each of which is connected to a corresponding column of the memory array and a pre-charging bus is connected to the switching circuits, the method comprising:
    the plurality of switching circuits receiving a ground line signal for coupling each switching circuit to a ground voltage and a corresponding ground line and an inverted ground line signal
    selecting a corresponding ground line potential according to the ground line signal and the inverted ground line signal;
    performing a pre-charging operation to the switching circuits from the pre-charging bus; and changing the corresponding ground line of the selected switching circuit from coupling with the ground voltage to coupling with the pre-charging bus when the selected ground line signal changes from an enable state to a disable state, wherein the corresponding ground line and the other ground line of the non-selected switching circuit couples with the pre-charging bus to initiate a pre-charging operation.

8. A rapid equalizing ground line method for a memory chip, wherein the memory chip comprises a ground line circuit, a memory array and a bit line circuit coupled sequentially, and the ground line circuit comprises a plurality of switching circuits each of which is connected to a corresponding column of the memory array and a pre-charging bus is connected to the switching circuits and a control transistor, which has a first terminal coupled to a capacitor, a second terminal coupled to the pre-charging bus and a gate terminal coupled to a control signal terminal, the method comprising:

the plurality of switching circuits receiving a ground line signal for coupling each switching circuit to a ground voltage and a corresponding ground line and an inverted ground line signal selecting a corresponding ground line potential according to the ground line signal and the inverted ground line signal;

connecting the capacitor to the pre-charging bus for a pre-charging operation according to the control signal;

performing a pre-charging operation to the switching circuits from the pre-charging bus; and coupling the corresponding ground link and reference voltage of the switching circuit with the pre-charging bus to initiate a pre-charging operation if the ground line signal is disabled; and initiating a data sensing operation by the selected switching circuit if the ground line signal is enabled, and coupling the corresponding ground line of the non-selected switching circuit with the pre-charging bus to continue with the pre-charging operation.

* * * * *